United States Patent
Taniuchi et al.

[11] Patent Number: 5,959,565
[45] Date of Patent: Sep. 28, 1999

[54] SWITCHED CAPACITOR

[75] Inventors: Koji Taniuchi; Shuji Nishitani, both of Kyoto, Japan

[73] Assignee: Rohm Co., Ltd., Kyoto, Japan

[21] Appl. No.: 08/978,379

[22] Filed: Nov. 25, 1997

[30]     Foreign Application Priority Data

Nov. 29, 1996  [JP]  Japan .................................. H8-318925

[51] Int. Cl.$^6$ .................................................. H03M 1/00
[52] U.S. Cl. .......................... 341/172; 333/173; 327/454
[58] Field of Search ........................... 341/172; 333/173; 327/554, 555

[56]            References Cited

U.S. PATENT DOCUMENTS

| | | | |
|---|---|---|---|
| 5,351,050 | 9/1994 | Thompson et al. | 341/172 |
| 5,574,457 | 11/1996 | Garrity et al. | 341/172 |
| 5,638,020 | 6/1997 | Koifman et al. | 327/554 |
| 5,699,006 | 12/1997 | Zele et al. | 327/554 |
| 5,703,589 | 12/1997 | Kalthoff et al. | 341/172 |

*Primary Examiner*—Howard L. Williams
*Attorney, Agent, or Firm*—Nikaido, Marmelstein, Murray & Oram LLP

[57]            ABSTRACT

A switched capacitor includes two capacitors. During the charging period, the first capacitor is connected to an input potential and a first reference potential, and the second capacitor is connected to the input potential and a second reference potential. During the discharging period, those electrodes of the first and second capacitors which have been connected to the input potential are connected to a first and a second reference potential, respectively, and those which have been connected to the first and second reference potentials, respectively, are connected to an output terminal. The switched capacitor also has a circuit that is connected to the first and second reference potentials to produce an intermediate potential therebetween so that, before the charging period, the first capacitor is connected to the intermediate potential and the first reference potential and the second capacitor is connected to the intermediate potential and the second reference potential.

4 Claims, 5 Drawing Sheets

SWITCHED CAPACITOR

BACKGROUND OF THE INVENTION

1. Field of the Invention

The present invention relates to a switched capacitor for use in an over-sampling analog-to-digital converter or similar circuits.

2. Description of the Prior Art

Switched capacitors are widely used, in particular to achieve over-sampling or similar processing, as a device for detecting a change in potential by converting it into amount of electric charge stored therein. In practical use, a switched capacitor is, during a sampling period, charged by being connected to an input potential to be measured, and, during a detection period that follows the sampling period, the switched capacitor is disconnected from the input potential and instead connected to an integrating circuit or a similar circuit in order to detect the charge stored therein.

FIG. 5 shows the construction of a conventional switched capacitor along with an integrating circuit connected thereto. The switched capacitor 90 consists of a single capacitor 95 and four switches 91 to 94. One electrode of the capacitor 95 is connected either to an input potential $V_{IN}$ or to a reference potential $V_{REF}$ through the switch 91 or 92, respectively and the other electrode of the capacitor 95 is connected either to the integrating circuit 98 or to the reference potential $V_{REF}$ through the switch 93 or 94, respectively. The reference potential $V_{REF}$ to which one electrode of the capacitor 95 is connected through the switch 92 and the reference potential $V_{REF}$ to which the other electrode of the capacitor 95 is connected through the switch 94 are equal.

The four switches 91 to 94 operate in synchronism. During a sampling period, the switches 91 and 94 are closed, whereas the switches 92 and 93 are open; during a detection period, the switches 92 and 93 are closed, whereas the switches 91 and 94 are open. Accordingly, during the sampling period, the capacitor 95 is charged by the potential difference between the reference potential $V_{REF}$ and the input potential $V_{IN}$, and, during the detecting period, the capacitor 95 adds the potential arising from the charging to the reference potential $V_{REF}$ and outputs the resultant potential to the integrating circuit 98. Thus, the output potential $V_{OUT}'$ of the switched capacitor 90 is expressed as $V_{OUT}' = V_{REF} - V_{IN}$.

The integrating circuit 98 consists of an amplifier 96 and a capacitor 97. The amplifier 96 receives, at its inverting input terminal, the output potential $V_{OUT}'$ of the switched capacitor 90 and, at its non-inverting input terminal, the reference potential $V_{REF}$. The capacitor 97 is connected in parallel between the output terminal and the inverting input terminal of the amplifier 96. Thus, the integrating circuit 98 integrates the difference between the output potential $V_{OUT}'$ of the switched capacitor 90 and the reference potential $V_{REF}$.

During the detection period, the integrating circuit 98 continues integrating the output potential $V_{OUT}'$ of the switched capacitor 90 and outputs a potential $V_0'$ that corresponds to the amount of charge stored in the switched capacitor 90. Let the capacitance of the capacitor 95 be C' and that of the capacitor 97 be $C_{NF}'$. Then, the output potential $V^{0'}$ of the integrating circuit 98 is expressed as $V_0' = C'/C_{NF}' \cdot (V_{IN} - V_{REF})$.

The reference potential $V_{REF}$ fed to the non-inverting input terminal of the amplifier 96 of the integrating circuit 98 is equal to the reference potential $V_{REF}$ fed to the switched capacitor 90, both being supplied from a single power supply circuit. This reference potential $V_{REF}$ is supplied also to other circuits that are not shown in the figure.

This, however, causes a problem: the current that charges the switched capacitor 90 during the sampling period, as well as the current that results from the discharging of the switched capacitor 90 during the detection period, causes variation in the reference potential $V_{REF}$. This variation is greater as the capacitance C' of the capacitor 95 is greater, and is harsher as the sampling and detection periods are shorter. Variation in the reference potential $V_{REF}$ causes unstable operation of not only the integrating circuit 98 but all the circuits that use the reference potential $V_{REF}$, and thus leads to reduced reliability of any circuit or device that includes the switched capacitor 90.

To secure stable operation of related circuits, it is essential to prevent the charging and discharging currents from affecting the reference potential $V_{REF}$. To achieve this, it has been customary to take some external measures, such as using an unduly high-capacity, high-performance power supply circuit to produce the reference potential $V_{REF}$, or using a high-capacitance capacitor to absorb the charging and discharging currents. As a result, with conventional switched capacitors, it has been inevitable to adopt an unduly large-scale circuit design and use an undue number of externally fitted parts, and thus it has been difficult to achieve sufficient simplification of design and reduction of size in circuits and devices that employ such switched capacitors.

SUMMARY OF THE INVENTION

An object of the present invention is to provide a switched capacitor that has a simple circuit design and nevertheless operates sufficiently fast without affecting a reference potential.

To achieve the above object, according to the present invention, a switched capacitor that stores electric charge supplied via an input terminal during a first period and that outputs the stored electric charge via an output terminal during a second period is provided with a first reference terminal for receiving a first reference potential; a second reference terminal for receiving a second reference potential; a first capacitor, of which a first electrode is connected to said input terminal and a second electrode is connected to said first reference terminal during said first period, and of which the first electrode is connected to said first reference terminal and the second electrode is connected to said output terminal during the second period; and a second capacitor, of which a first electrode is connected to said input terminal and a second electrode is connected to said second reference terminal during said first period, and of which the first electrode is connected to said second reference terminal and the second electrode is connected to said output terminal during the second period.

The first and second capacitors are connected in parallel between the input terminal and the output terminal; both capacitors are charged during the first period, and they discharge during the second period. The first capacitor is charged by the difference between the input potential applied to the input terminal and the first reference potential; the second capacitor is charged by the difference between the input potential and the second reference potential. During charging, the second electrode of the first capacitor and that of the second capacitor are at different potentials; during discharging, the first electrode of the first capacitor and that of the second capacitor are at different potentials.

The potential at the output terminal during discharging equals to the difference between the input potential and a constant value that depends on the capacitances of the first and second capacitors and on the first and second reference potentials; for example, a variation of +1 V in the input potential causes a variation of −1 V in the potential at the output terminal. The above-mentioned constant value can be set to a desired value by appropriately setting the capacitances of the first and second capacitors and the first and second reference potentials. Accordingly, it is possible to set these first and second reference potentials to potentials different from the reference potential common to the entire circuit or device in which the switched capacitor is incorporated, while keeping the potential at the output terminal within a range usable as the reference potential common to the entire circuit or device.

This eliminates the need for the switched capacitor to obtain reference potentials from the common reference potential, and, in this way, it is possible to prevent variation in the common reference potential arising from the charging and discharging of the switched capacitor. As a result, it is possible to stabilize the operation of other circuit. Moreover, since there is no need to provide special means to stabilize the common reference potential, it is possible to simplify the designs of the other circuits.

In addition, since the output potential can be set to a desired potential by appropriately setting one or a combination of four variables, it is possible to set the output potential considerably freely, and this in turn helps reduce limitations imposed on the other circuits with which the switched capacitor is used, and thus helps simplify the design of the circuit or device as a whole.

Additionally, the above switched capacitor according to the invention may be further provided with a potential conversion circuit that is connected to the first and second reference terminals to output an approximately intermediate potential between the first and second reference potentials, so that, during a third period immediately before the first period, the first capacitor will have its first electrode connected to an output of the potential conversion circuit and its second electrode connected to the first reference terminal, and that the second capacitor will have its first electrode connected to the output of the potential conversion circuit and its second electrode connected to the second reference terminal.

During the third period, the first capacitor is charged by a potential difference that is approximately half the difference between the first and second reference potentials, and the second capacitor is charged by a potential difference that is approximately half the difference between the second and first reference potentials. As a result, when the input potential applied to the input terminal is in the middle between the first and second reference potentials, the first and second capacitors are each charged, beforehand during the third period, with nearly that amount of charge with which they are charged during the first period.

Such precharging allows the switched capacitor to be charged properly in accordance with the input potential even in cases where the first period, i.e. the charging period, is considerably short. This switched capacitor excels in fast response, and is therefore suitable for use in a circuit that requires switching between charging and discharging at short intervals.

The above switched capacitors according to the invention may be so designed that the first and second capacitors have equal capacitances. In that case, the potential at the output terminal during the second period equals to half the difference between the input potential and the sum of the first and second reference potentials, and thus it does not depend on the absolute capacitances of the capacitors. In other words, it is possible to set the capacitances freely without affecting the output potential. Moreover, since the output potential corresponds linearly to the sum of the two reference potentials, it is extremely easy to adjust the output potential. This allows easy combination of the switched capacitor with other circuits, and thus makes the switched capacitor suitable for a wider range of applications.

The above switched capacitors according to the invention may be so designed that the first reference terminal is connected to a power source that produces a predetermined potential and the second reference terminal is grounded. In this case, the switched capacitor operates on a single power source. This switched capacitor uses the ground potential as the second reference potential, and, if it is provided with a potential conversion circuit, its output approximately equals to half the potential supplied from the power source.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
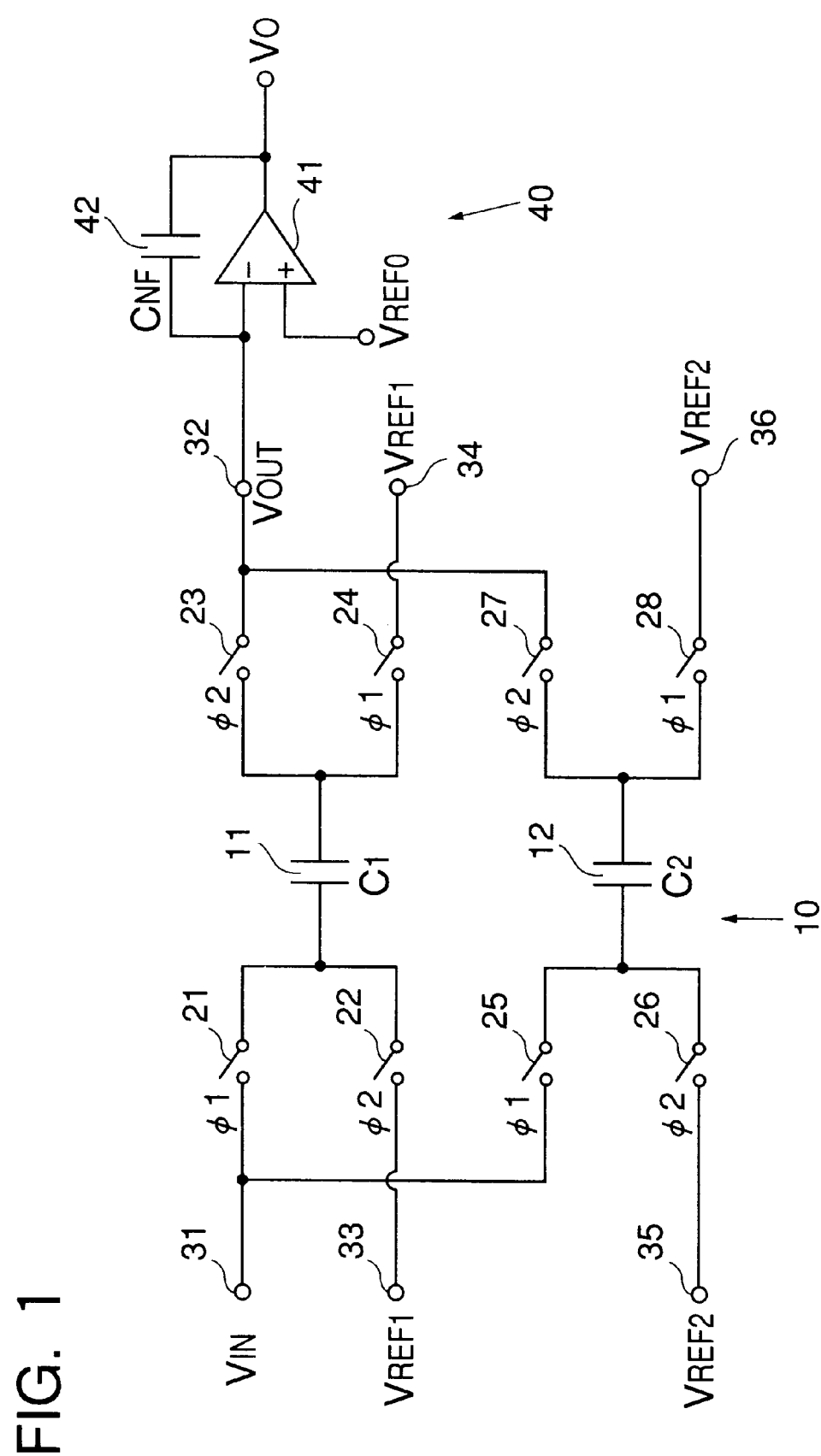
FIG. 1 is a circuit diagram of a switched capacitor, as a first embodiment of the invention, connected to an integrating circuit.

FIG. 1 shows the construction of a switched capacitor, as a first embodiment of the present invention, connected to an integrating circuit. The switched capacitor 10 of the first embodiment consists of two capacitors 11 and 12 and eight analog switches 21 to 28, and has six terminals 31 to 36.

The terminals 31 and 32 are an input terminal and an output terminal, respectively; the other terminals 33, 34, 35, and 36 are reference terminals through which the switched capacitor 10 receives reference potentials. The switched capacitor 10 receives an input potential $V_{IN}$ as the target of potential detection through the input terminal 31, a first reference potential $V_{REF1}$ at the reference terminals 33 and 34, and a second reference potential $V_{REF2}$ at the reference terminals 35 and 36. The first and second reference potentials $V_{REF1}$ and $V_{REF2}$ are produced by a power supply circuit (not shown) so as to have different potentials.

One electrode of the first capacitor 11 is connected through the switch 21 to the input terminal 31 and is also connected through the switch 22 to the reference terminal 33. The other electrode of the first capacitor 11 is connected through the switch 23 to the output terminal 32, and is also connected through the switch 24 to the reference terminal 34. One electrode of the second capacitor 12 is connected through the switch 25 to the input terminal 31. and is also connected through the switch 26 to the reference terminal 35. The other electrode of the second capacitor 12 is connected through the switch 27 to the output terminal 32, and is also connected through the switch 28 to the reference terminal 36.

Thus, these two capacitors 11 and 12 are connected in parallel between the input and output terminals 31 and 32. Note however that, as described later, the two capacitors 11 and 12 are never simultaneously connected to the input and output terminals 31 and 32.

Figure 2:
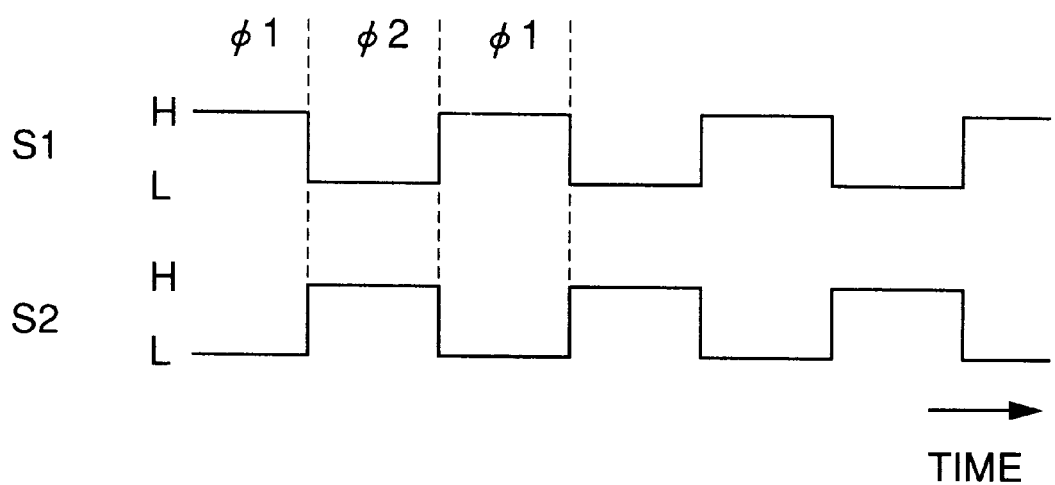
FIG 2 is a diagram showing the signals with which the switching of the switched capacitor of the first embodiment is controlled.

The eight switches 21 to 28 operate periodically in synchronism with one another. FIG. 2 shows the signals that control these switches. Signal S1 is fed to the switches 21, 24, 25, and 28 to control their state (open or closed). Signal S1 is a rectangular-wave signal that is either in a high-level state (high) or in a low-level state (low) at a time. The switches 21, 24, 25, and 28 are closed when signal S1 is high, and are open when signal S1 is low. Signal S2 is fed to the switches 22, 23, 26, and 27 to control their state. Signal S2 is also a rectangular-wave signal that is either high or low at a time. The switches 22, 23, 26, and 27 are closed when signal S2 is high, and are open when signal S2 is low.

Signals S1 and S2 are so produced that when one is high, the other is low. The period $\Phi 1$ in which signal S1 is high (signal S2 is low) corresponds to the sampling period in which the capacitors 11 and 12 are charged; the period $\Phi 2$ in which signal S2 is high (signal S1 is low) corresponds to the detection period in which the electric charges stored in the capacitors 11 and 12 are detected. In FIG. 1, each switch is marked with $\Phi 1$ or $\Phi 2$ to indicate the period in which it is closed.

The capacitor 11 is during the sampling period $\Phi 1$ connected between the input terminal 31 and the reference terminal 34, and is thus charged by the difference in potential $V_{REF1}-V_{IN}$ between the first reference potential $V_{REF1}$ and the input potential $V_{IN}$. Let the capacitance of the capacitor 11 be $C_1$; then the charge $Q_1$ stored therein is expressed by equation (1) below. The capacitor 12 is during the sampling period $\Phi 1$ connected between the input terminal 31 and the reference terminal 36, and is thus charged by the difference in potential $V_{REF2}-V_{IN}$ between the second reference potential $V_{REF2}$ and the input potential $V_{IN}$. Let the capacitance of the capacitor 12 be $C_2$; then the charge $Q_2$ stored therein is expressed by equation (2) below.

$$Q_1 = C_1 \cdot (V_{REF1} - V_{IN}) \quad (1)$$

$$Q_2 = C_2 \cdot (V_{REF2} - V_{IN}) \quad (2)$$

During the detection period $\Phi 2$, the capacitor 11 is connected between the reference terminal 33 and the output terminal 32, and the capacitor 12 is connected between the reference terminal 35 and the output terminal 32. Since the first and second potentials $V_{REF1}$ and $V_{REF2}$ are applied to the reference terminals 33 and 35, respectively, and since the charges $Q_1$ and $Q_2$ stored in the capacitors 11 and 12 are expressed by equations (1) and (2), respectively, it follows that the potential $V_{OUT}$ appearing at the output terminal 32 is expressed by equation (3) below.

$$V_{OUT} = (C_1 \cdot V_{REF1} + C_2 \cdot V_{REF2})/(C_1 + C_2) - V_{IN} \quad (3)$$

From equation (3), it is clear that the output potential $V_{OUT}$ of the switched capacitor 10 equals to the difference between the input potential $V_{IN}$ and a constant that depends on the capacitances $C_1$ and $C_2$ of the capacitors 11 and 12 and on the two reference potentials $V_{REF1}$ and $V_{REF2}$. This means that the output potential $V_{OUT}$ can be adjusted by varying any of the capacitances $C_1$ and $C_2$ and the reference potentials $V_{REF1}$ and $V_{REF2}$, and thus it is possible to set the output potential $V_{OUT}$ to a desired value by appropriately setting one or a combination of these four variables.

In particular, when the capacitances $C_1$ and $C_2$ of the capacitors 11 and 12 are equal, equation (3) can be reduced to equation (4) below. In this case, the output potential $V_{OUT}$ of the switched capacitor 10 depends solely on the reference potentials $V_{REF1}$ and $V_{REF2}$, that is, it does not depend on the capacitances $C_1$ and $C_2$ of the capacitors 11 and 12. This makes it possible to obtain the same output potential $V_{OUT}$ regardless of the capacitance of the switched capacitor 10 as a whole.

$$V_{OUT} = (V_{REF1} + V_{REF2})/2 - V_{IN} \quad (4)$$

The integrating circuit 40 consists of an amplifier 41 and a capacitor 42, with the capacitor 42 connected in parallel with the amplifier 41 between its output terminal and inverting input terminal. The amplifier 41 has its inverting input terminal connected to the output terminal 32 of the switched capacitor 10 to receive the output potential $V_{OUT}$ appearing there during the detection period $\Phi 2$. At its non-inverting input terminal, the amplifier 41 receives another reference potential $V_{REF0}$, which is a reference potential that is common to, and thus supplied to, other circuits that are not shown in the figure as well. This reference potential $V_{REF0}$ is different from either of the first and second reference potentials $V_{REF1}$ and $V_{REF2}$ supplied to the switched capacitor 10, but is produced by the same power supply circuit as the latter two.

The integrating circuit 40 integrates the output potential $V_{OUT}$ of the switched capacitor 10 during the detection period $\Phi 2$, and then amplifies and outputs it. From the potential $V_0$ appearing at the output terminal of the integrating circuit 40, it is possible to know the amount of charge stored in the switched capacitor 10 during the sampling period $\Phi 1$, that is, the magnitude of the input potential $V_{IN}$.

As described heretofore, this switched capacitor 10 is not connected to the reference potential $V_{REF0}$. As a result, neither the charging current during the sampling period $\Phi 1$ nor the discharging current during the detection period $\Phi 2$ causes variation in the reference potential $V_{REF0}$. This makes it possible to stably keep constant the reference potential $V_{REF0}$ supplied to the integrating circuit 40, and thus to allow the integrating circuit 40 to output its output potential $V_0$ with variation that accurately reflects variation in the input potential $V_{IN}$. Thus, the combination of the switched capacitor 10 and the integrating circuit 40 not only realizes highly accurate detection of the input potential $V_{IN}$, but also ensures stable operation of the other circuits to which the reference potential $V_{REF0}$ is supplied.

In this way, since this switched capacitor 10 does not cause variation in the reference potential $V_{REF0}$, it does not require the use of an unduly high-performance power supply circuit to produce reference potentials $V_{REF0}$, $V_{REF1}$, and $V_{REF2}$; nor does it need to be fitted with an external, high-capacitance capacitor to stabilize the reference potential $V_{REF0}$.

The lengths of the sampling period $\Phi 1$ and the detection period $\Phi 2$ may or may not be equal; in consideration of the intervals at which sampling needs to be performed and the capacitances of the capacitors 11 and 12, the lengths of those periods are so determined that the input potential $V_{IN}$ can complete the charging of the capacitors within the sampling period $\Phi 1$ and the integrating circuit 40 can complete the detection of the amount of the stored charges within the detection period Φ2. Moreover, the sampling period Φ1 does not necessarily have to follow immediately after the detection period Φ2; in other words, it is also possible to secure an extra period therebetween during which neither sampling nor detection takes place.

Let the capacitance of the capacitor 42 be $C_{NF}$; then the output potential $V_0$ of the integrating circuit 40 is expressed by equation (5) below.

$$V_0 = (C_1 + C_2)/C_{NF} \cdot (V_{IN} - V_{REF0}) \quad (5)$$

Figure 5:
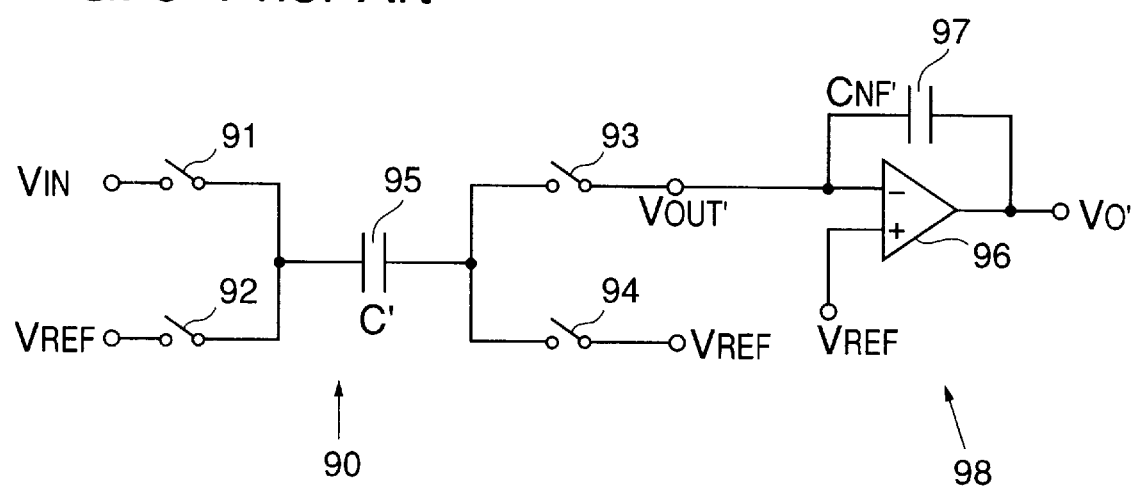
FIG. 5 is a circuit diagram of a conventional switched capacitor connected to an integrating circuit.

In particular, when the capacitances $C_1$ and $C_2$ of the capacitors 11 and 12 of the switched capacitor 10 are made equal and, in addition, the reference potential $V_{REF0}$ supplied to the non-inverting input terminal of the integrating circuit 40 is set to the middle value between the two reference potentials $V_{REF1}$ and $V_{REF2}$ supplied to the switched capacitor 10, the output potential $V_0$ is expressed by equation (6) below. Equation (6) shows that, in this switched capacitor 10, the integrating circuit 40 provides twice as high a gain for the reference potential $V_{REF0}$ as in the conventional construction shown in FIG. 5.

$$V_0 = 2 \cdot C_1/C_{NF} \cdot \{V_{IN} - (V_{REF1} + V_{REF2})/2\} \quad (6)$$

This switched capacitor 10 is designed to receive two reference potentials $V_{REF1}$ and $V_{REF2}$ from a power supply circuit. However, it is also possible to design the switched capacitor 10 to receive only one reference potential from a power supply circuit and use the ground potential as another. This is achieved, for example, by grounding the two reference terminals 35 and 36 connected to the capacitor 12.

In that case, since $V_{REF2}=0$, equation (3), which expresses the output potential $V_{OUT}$ of the switched capacitor 10, is reduced to equation (7) below, and, if in addition the capacitances $C_1$ and $C_2$ of the capacitors 11 and 12 are equal, it is further reduced to equation (8) below. On the other hand, equation (6), which expresses the output potential of the integrating circuit 40, is reduced to equation (9) below.

$$V_{OUT} = C_1 \cdot V_{REF1}/(C_1 + C_2) - V_{IN} \quad (7)$$

$$V_{OUT} = V_{REF1}/2 - V_{IN} \quad (8)$$

$$V_0 = 2 \cdot C_1/C_{NF} \cdot (V_{IN} - V_{REF1}/2) \quad (9)$$

By using the ground potential as the second reference potential $V_{REF2}$, the switched capacitor 10 operates on a single power source. This helps simplify not only the wiring for the supply of the reference potential, but also the design of the power supply circuit.

Figure 3:
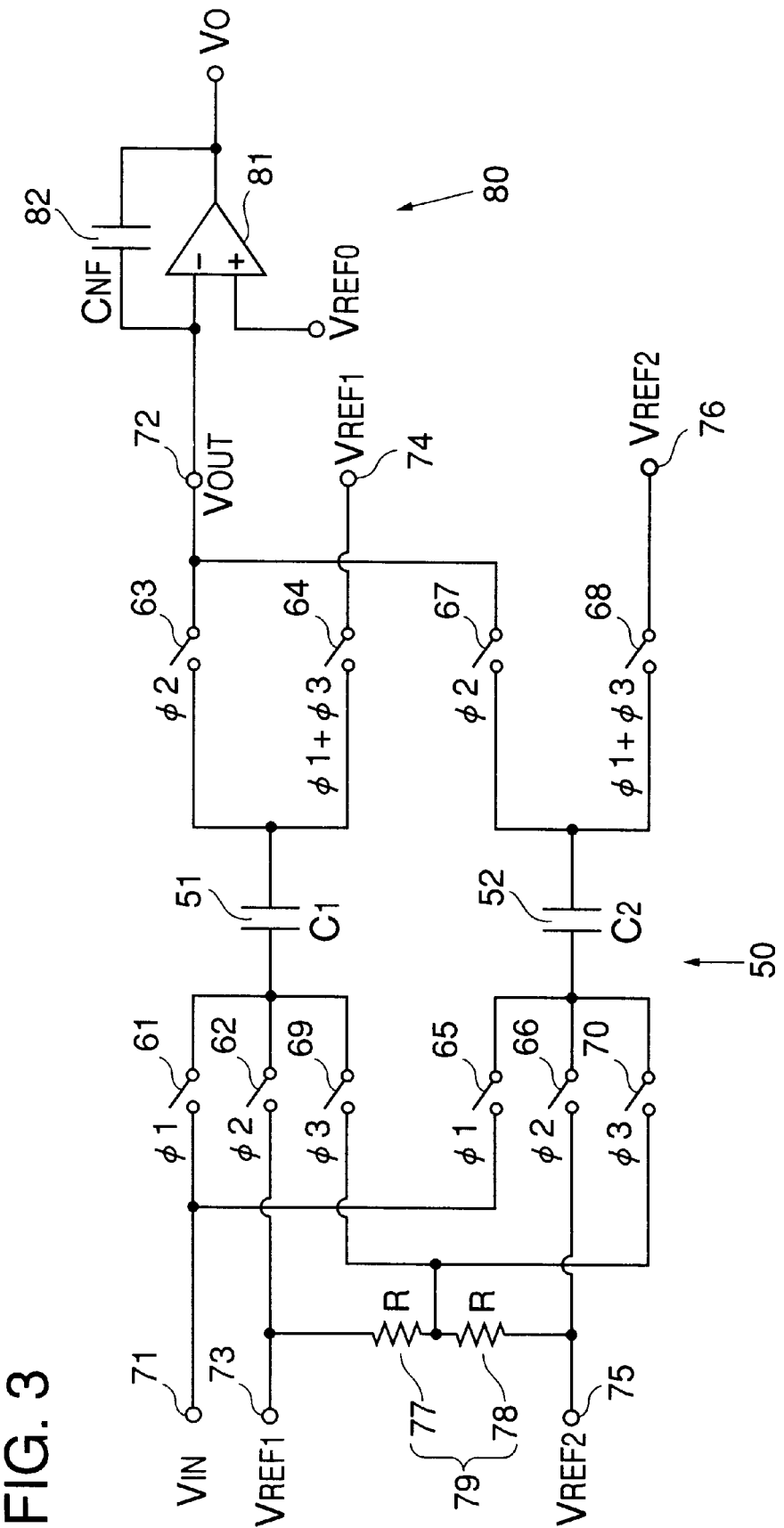
FIG. 3 is a circuit diagram of another switched capacitor, as a second embodiment of the invention, connected to an integrating circuit.

FIG. 3 shows the construction of another switched capacitor, as a second embodiment of the present invention, connected to an integrating circuit. The switched capacitor 50 of the second embodiment consists of two capacitors 51 and 52 and ten analog switches 61 to 70, and has six terminals 71 to 76. In addition, this switched capacitor 50 is further provided with a potential conversion circuit 79 consisting of two resistors 77 and 78 having equal resistances.

Thus, the switched capacitor 50 of the second embodiment is constructed in the same manner as the switched capacitor 10 of the first embodiment except that it additionally has two more switches 69 and 70 and a potential conversion circuit 79. The potential conversion circuit 79 is connected between the reference terminal 73 to which the first reference potential $V_{REF1}$ is applied and the reference terminal 75 to which the second reference potential $V_{REF2}$ is applied so that the middle potential $(V_{REF1}+V_{REF2})/2$ between the two reference potentials will be obtained.

One electrode of the first capacitor 51 is connected through the switch 61 to the input terminal 71, is also connected through the switch 62 to the reference terminal 73, and is additionally connected through the switch 69 to the output of the potential conversion circuit 79. One electrode of the second capacitor 52 is connected through the switch 65 to the input terminal 71, is also connected through the switch 66 to the reference terminal 75, and is additionally connected through the switch 70 to the output of the potential conversion circuit 79. The wiring from the other electrodes of the capacitors 51 and 52 to the output terminal 72 and to the reference terminals 74 and 76, as well as the construction of the integrating circuit 80, is quite the same as in the first embodiment, and therefore overlapping explanations will not be repeated.

Figure 4:
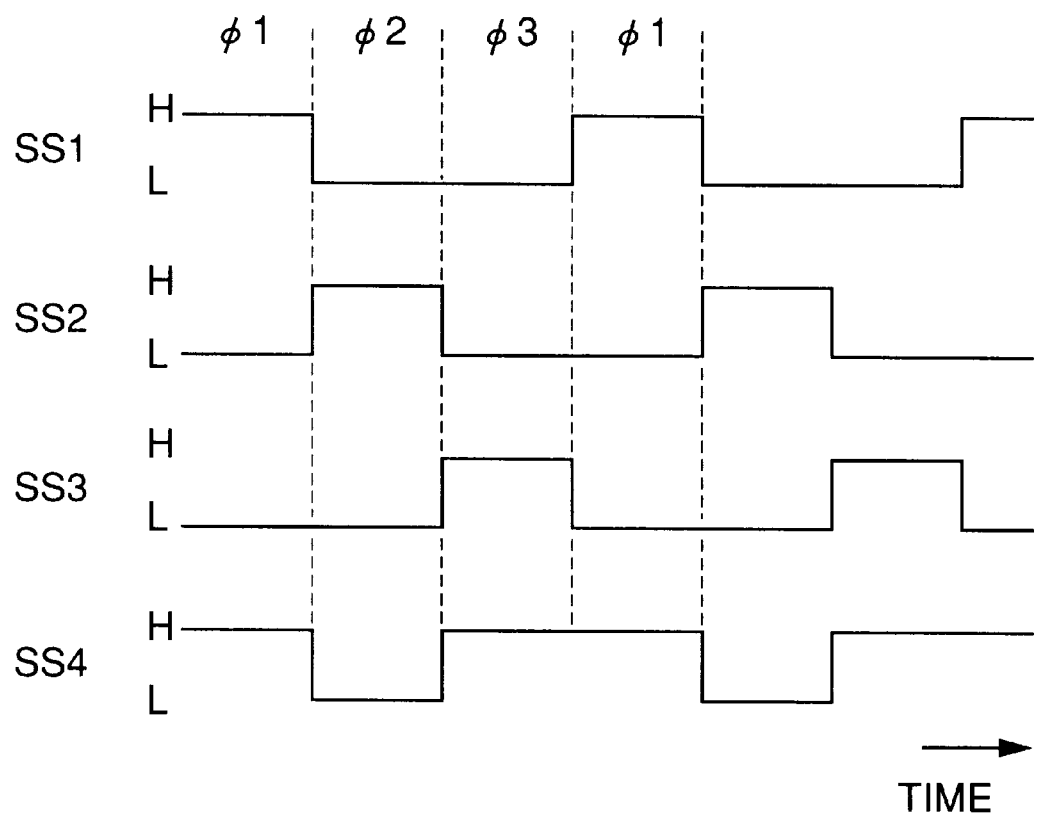
FIG. 4 is a diagram showing the signals with which the switching of the switched capacitor of the second embodiment is controlled.

FIG. 4 shows the signals that control the ten switches 61 to 70. Signal SS1 is fed to the switches 61 and 65; signal SS2 is fed to the switches 62, 63, 66, and 67; signal SS3 is fed to the switches 69 and 70; signal SS4 is fed to the switches 64 and 68. Each of these signals is a rectangular-wave signal that periodically toggles between a high-level state (high) and a low-level state (low); each switch is closed when the signal it receives is high, and is open when the signal it receives is low.

Signal SS3 becomes high at the same time that signal SS2 becomes low, and becomes low at the same time that signal SS1 becomes high. Signal SS4 is held high as long as signal SS3 or SS1 is high. The period Φ1 in which signals SS1 and SS4 are both high corresponds to the sampling period, and the period Φ2 in which signal SS2 is high corresponds to the detection period.

During the period Φ3 in which signals SS3 and SS4 are both high, the capacitor 51 is charged by being connected between the potential conversion circuit 79 and the reference terminal 74 to which the first reference potential $V_{REF1}$ is applied, and the capacitor 52 is charged by being connected between the potential conversion circuit 79 and the reference terminal 76 to which the second reference potential $V_{REF2}$ is applied. In FIG. 3, each switch is marked with Φ1, Φ2, and/or Φ3 to indicate the period in which it is closed.

In this way, this switched capacitor 50 is designed to be forcibly charged by a predetermined voltage during the period Φ3 after the completion of the detection period Φ2 and before the beginning of the next sampling period Φ1. At this time, the voltages applied to the capacitors 51 and 52 are $V_{REF1}-(V_{REF1}+V_{REF2})/2$ and $V_{REF2}-(V_{REF1+}V_{REF2})/2$, respectively. On the other hand, during the sampling period Φ1, the voltages applied to the capacitors 51 and 52 are $V_{REF1}-V_{IN}$ and $V_{REF2}-V_{IN}$, respectively, and the middle value $(V_{REF1}+V_{REF2})/2$ is close to the input potential $V_{IN}$. As a result, during the period Φ3, the switched capacitor 50 is charged beforehand with nearly that amount of electric charge with which it will be charged during the sampling period Φ1.

Thus, the period Φ3 serves as a precharging period, and the sampling period Φ1 itself serves rather to fine-adjust the amount of charge, allowing supplementary charging in case the switched capacitor 50 has not been charged sufficiently during the precharging period Φ3, and allowing discharging of extra charge in case it has been charged excessively. During the precharging period Φ3, charging can be completed quickly by the use of electric power supplied from the power source; on the other hand, during the sampling period Φ1, simply fine-adjusting the amount of charge can be completed quickly. As a result, the switched capacitor 50 takes less time to be charged with the amount of charge corresponding to the input potential $V_{IN}$ than in cases where no precharging period Φ3 is provided.

Consequently, this switched capacitor 50 allows accurate detection of the input potential even when it is made to operate at a considerably high rate, and thus it can suitably be used in circuits and devices that perform sampling at short intervals. Note that the length of the precharging period Φ3 may be equal to that of the sampling period Φ1 or of the detection period Φ2, or these three periods Φ1, Φ2, and Φ3 may have different lengths.

In the switched capacitor 50, the capacitances $C_1$ and $C_2$ of the capacitors 51 and 52, the reference potentials $V_{REF1}$ and $V_{REF2}$, the output potential $V_{OUT}$ appearing at the output terminal 72, the output potential $V_0$ of the integrating circuit 80, and others have quite the same relations as in the switched capacitor 10 of the first embodiment. In addition, here, since the potential conversion circuit 79 produces the middle potential from the reference potentials $V_{REF1}$ and $V_{REF2}$, no variation is caused, during the precharging period Φ3 as well as during the sampling and detection periods Φ1 and Φ2, in the reference potential $V_{REF0}$ that is supplied to the integrating circuit 80 and to other circuits.

It is possible to design this switched capacitor 50, too, to receive only one reference potential $V_{REF1}$ from a power supply circuit and use the ground potential as another reference potential $V_{REF2}$ by grounding the terminals 75 and 76. This helps simplify the wiring for the reference potential as well as the design of the power supply circuit. Note however that, when there is a great difference between the input potential $V_{IN}$ and the ground potential, it is preferable to supply both reference potentials $V_{REF1}$ and $V_{REF2}$ from a power supply circuit so that the switched capacitor 50 will be, during the precharging period Φ3, charged with an amount of charge as close as possible to the amount that corresponds to the input potential $V_{IN}$.

In this embodiment, the potential conversion circuit 79 consists of two resistors 77 and 78 having equal resistances; however, these resistors 77 and 78 may have different resistances. In that case, these resistances are determined, in consideration of the input potential $V_{IN}$, the capacitances $C_1$ and $C_2$ of the capacitors 51 and 52, and others, so that the switched capacitor 50 will be, during the precharging period Φ3, charged with an amount of charge as close as possible to the amount with which it is typically charged during the sampling period Φ1.

Obviously, many modifications and variations of the present invention are possible in light of the above teachings. It is therefore to be understood that within the scope of the appended claims, the invention may be practiced other than as specifically described.

What is claimed is:

1. A switched capacitor that stores electrical charge supplied via an input terminal during a first period and that outputs the stored electrical charge via an output terminal during a second period, comprising;

a first reference terminal for receiving a first reference potential;

a second reference terminal for receiving a second reference potential;

a first capacitor, of which a first electrode is connected to said input terminal and a second electrode is connected to said first reference terminal during said first period, and of which the first electrode is connected to said first reference terminal and the second electrode is connected to said output terminal during the second period; and a second capacitor, of which a first electrode is connected to said input terminal and a second electrode is connected to said second reference terminal during said first period, and of which the first electrode is connected to said second reference terminal and the second electrode is connected to said output terminal during the second period.

2. A switched capacitor as claimed in claim 1, further comprising:

a potential conversion circuit that is connected to said first and second reference terminals to output an approximately intermediate potential between said first and second reference potentials, wherein, during a third period immediately before said first period, said first capacitor has its first electrode connected to an output of said potential conversion circuit and its second electrode connected to said first reference terminal, and said second capacitor has its first electrode connected to the output of said potential conversion circuit and its second electrode connected to said second reference terminal.

3. A switched capacitor as claimed in claim 1, wherein said first and second capacitors have a same capacitance.

4. A switched capacitor as claimed in claim 1, wherein said first reference terminal is connected to a power source that produces a predetermined potential and said second reference terminal is grounded.

* * * * *